(12) United States Patent
Nguyen et al.

(10) Patent No.: US 11,302,739 B1
(45) Date of Patent: Apr. 12, 2022

(54) HIGH QUANTUM EFFICIENCY SUPERLATTICE INFRARED DETECTOR

(71) Applicant: HRL Laboratories, LLC, Malibu, CA (US)

(72) Inventors: Minh B. Nguyen, Thousand Oaks, CA (US); Rajesh D. Rajavel, Oak Park, CA (US); David H. Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 88 days.

(21) Appl. No.: 15/226,787

(22) Filed: Aug. 2, 2016

Related U.S. Application Data

(60) Provisional application No. 62/212,418, filed on Aug. 31, 2015.

(51) Int. Cl.
*H01L 29/06* (2006.01)
*H01L 31/00* (2006.01)
*H01L 27/146* (2006.01)

(52) U.S. Cl.
CPC .... *H01L 27/14669* (2013.01); *H01L 27/1461* (2013.01); *H01L 27/14636* (2013.01); *H01L 27/14685* (2013.01); *H01L 27/14694* (2013.01)

(58) Field of Classification Search
CPC ... H01L 2224/48091; H01L 31/035236; H01L 31/03046; H01L 2924/00014; H01L 2224/48465; H01L 2924/00; H01L 31/109; H01L 31/101; H01L 31/0304; H01L 31/09; H01L 31/105; H01L 27/14634; H01L 27/14636
See application file for complete search history.

(56) References Cited

U.S. PATENT DOCUMENTS

| | | | | |
|---|---|---|---|---|
| 5,065,205 A | * | 11/1991 | Biefeld | B82Y 20/00 257/18 |
| 5,113,076 A | | 5/1992 | Schulte | |
| 5,518,934 A | * | 5/1996 | Forrest | H01L 27/14649 117/56 |
| 5,563,423 A | * | 10/1996 | Wu | B82Y 20/00 257/17 |
| 5,625,635 A | * | 4/1997 | Kurtz | B82Y 20/00 257/103 |
| 5,995,529 A | * | 11/1999 | Kurtz | B82Y 20/00 257/94 |
| 6,465,860 B2 | | 10/2002 | Shigenaka et al. | |

(Continued)

OTHER PUBLICATIONS

Boucenna et al., "Energy gaps and lattice dynamic properties of InAsxSb1-x", Mat. Sci. and Eng. B 138, p. 228-234. (Year: 2007).*

(Continued)

*Primary Examiner* — Meiya Li
(74) *Attorney, Agent, or Firm* — Lewis Roca Rothgerber Christie, LLP

(57) ABSTRACT

An infrared detector. The detector includes: a superlattice structure including: at least three first layers; and at least three second layers, alternating with the first layers. Each of the first layers includes, as a major component, $InAs_xP_{1-x}$, wherein x is between 0.0% and 99.0%, and each of the second layers includes, as a major component, $InAs_ySb_{1-y}$, wherein y is between 0% and 60%.

18 Claims, 4 Drawing Sheets

(56) References Cited

U.S. PATENT DOCUMENTS

| | | |
|---|---|---|
| 6,803,557 B1 | 10/2004 | Taylor et al. |
| 7,041,978 B2 | 5/2006 | Gravrand et al. |
| 7,652,252 B1 | 1/2010 | Rajavel et al. |
| 7,687,871 B2 | 3/2010 | Maimon |
| 7,737,411 B2 | 6/2010 | Gunapala et al. |
| 7,755,023 B1 | 7/2010 | Rajavel et al. |
| 7,800,067 B1 | 9/2010 | Rajavel et al. |
| 8,237,228 B2 | 8/2012 | Or-Bach et al. |
| 8,450,773 B1 | 5/2013 | Kim et al. |
| 8,928,029 B2 | 1/2015 | Ting et al. |
| 9,024,296 B2 | 5/2015 | Sundaram et al. |
| 9,146,157 B1 | 9/2015 | Rajavel et al. |
| 9,337,124 B1 | 5/2016 | Herrault et al. |
| 9,799,785 B1 | 10/2017 | Ting et al. |
| 2007/0215900 A1 | 9/2007 | Maimon |
| 2008/0111152 A1 | 5/2008 | Scott et al. |
| 2011/0147877 A1 | 6/2011 | Wehner et al. |
| 2014/0374701 A1* | 12/2014 | Wei .................. H01L 31/03046 257/18 |
| 2016/0087001 A1 | 3/2016 | Tennant et al. |
| 2016/0290865 A1 | 10/2016 | Delaunay |

OTHER PUBLICATIONS

Lockhart et al., "Terahertz emission mechanisms in InAsxP1-x", App. Phys. Letts 92, 011102. (Year: 2008).*

Biefeld et al., "Multistage infrared emitters based on InAsSb strained layers grown by metal-organic chemical vapor deposition", IEEE Xplore, p. 32-38, 2002. (Year: 2002).*

Dreiske, Peter D., "Development of Two-Color Focal-Plane Arrays Based on HDVIP", Infrared Technology and Applications XXXI, 2005, pp. 325-330, vol. 5783, SPIE, Bellingham, WA.

Hoang, A.M. et al., "Demonstration of high performance bias-selectable dual-band short-/mid- wavelength infrared photodetectors based on type-II InAs/GaSb/AlSb superlattices", Applied Physics Letters, 2013, p. 011108-1 through 011108-4, vol. 102, American Institute of Physics.

Sharifi, Hasan et al., "Fabrication of High Operating Temperature (HOT), Visible to MWIR, nCBn Photon-Trap Detector Arrays", Infrared Technology and Applications XXXIX, 2013, p. 87041U-1 through 87041U-6, vol. 8704, SPIE.

Brown, Gail J. et al., "Type-II InAs/GaSb superlattices for very long wavelength infrared detectors", Physica E, 2004, pp. 471-474.

Martyniuk, P. et al., "New concepts in infrared photodetector designs", Applied Physics Reviews, Journal of Applied Physics, Nov. 13, 2014, pp. 041102-1 through 041102-35, vol. 1.

Martyniuk, P. et al., "Barrier infrared detectors", Opto-Electronics Review, 2014, pp. 127-146, vol. 22, No. 2.

Smith, D. L. et al., "Proposal for strained type II superlattice infrared detectors", Journal of Applied Physics, Sep. 15, 1987, pp. 2545-2548, vol. 62, No. 6.

U.S. Office action dated Feb. 10, 2017, for cross reference U.S. Appl. No. 15/136,835, (7 pages).

U.S. Office action dated Dec. 4, 2017, for cross reference U.S. Appl. No. 15/235,010, (18 pages).

Radisic et al., "220-GHz Solid-State Power Amplifier Modules," IEEE Journal of Solid-State Circuits, 47(10): 2291-2297, Oct. 2012.

Samoska, "An Overview of Solid-State Integrated Circuit Amplifiers in the Submillimeter-Wave and THz Regime," IEEE Transactions on Terahertz Science and Technology, 1(1): 9-24, Sep. 2011.

U.S. Office action dated Jun. 29, 2018, for cross reference U.S. Appl. No. 15/235,010, (14 pages).

Biefeld, R. M. et al., "Multistage Infrared Emitters Based on InAsSb Strained Layers Grown by Metal Organic Chemical Vapor Deposition", 1998 Conference on Optoelectronic and Microelectronic Materials and Devices, Dec. 14-16, 1998, 9 pages, IEEE.

* cited by examiner

HIGH QUANTUM EFFICIENCY SUPERLATTICE INFRARED DETECTOR

CROSS-REFERENCE TO RELATED APPLICATION(S)

The present application claims priority to and the benefit of U.S. Provisional Application No. 62/212,418, filed Aug. 31, 2015, entitled "HIGH QUANTUM EFFICIENCY SUPERLATTICE INFRARED DETECTOR", the entire content of which is incorporated herein by reference.

FIELD

One or more aspects of embodiments according to the present invention relate to infrared detectors, and more particularly to an infrared detector including a superlattice structure.

BACKGROUND

In an infrared (IR) detector, the quantum efficiency (QE) may be increased by increasing the photon absorption using a thicker absorber layer. However, for an absorbing medium with short diffusion length, the absorption enhanced with a thicker absorber may not be efficiently converted into an electrical signal, hence bringing little improvement to the QE. Moreover, thickening the absorber layer may result in an increase in the volume of thermally generated carrier background, and may require a more complicated fabrication process, all of which may increase the risk of electrical performance deterioration.

For an IR detector with a superlattice absorber, the absorption coefficient may be increased by reducing the superlattice period (e.g., the total thickness of the constituent layers), but the improvement achievable may be limited due to constraints related to material quality and absorption wavelength. For example, in an IR detector with indium arsenide (InAs) and indium arsenide antimonide (InAsSb) layers, it may be necessary that the thickness of the InAs and InAsSb layers satisfy certain relationships to have the absorption in the IR regime, and it may also be necessary that they be balanced to be lattice matched with a gallium antimonide (GaSb) substrate to enable the formation of high quality materials. As a result of these two constraints, the InAs/InAsSb period may be in the range of 90 to over 100 Angstroms for a cut-off wavelength in the Long Wavelength Infrared regime (LWIR, $\lambda \sim 10$ µm) for example. This may result in performance that remains short of desired performance levels.

Thus, there is a need for an IR detector with improved quantum efficiency.

SUMMARY

Aspects of embodiments of the present disclosure are directed toward a high quantum efficiency superlattice infrared detector.

According to an embodiment of the present invention there is provided an infrared detector, including: an absorber layer including: a first superlattice structure including: at least three first layers; and at least three second layers, alternating with the first layers, each of the first layers including, as a major component, indium arsenide phosphide (InAs$_x$P$_{1-x}$), wherein x is between 0.0% and 99.0%, and each of the second layers including, as a major component, InAs$_y$Sb$_{1-y}$, wherein y is between 0% and 60%.

In one embodiment, the first superlattice structure includes an equal number of first and second layers.

In one embodiment, within one of the first layers x varies by more than 1%, and/or within one of the second layers y varies by more than 1%.

In one embodiment, each of the first layers has a thickness greater than 45 Angstroms and less than 70 Angstroms.

In one embodiment, each of the second layers has a thickness greater than 10 Angstroms and less than 25 Angstroms.

In one embodiment, x is greater than 60% and less than 80%.

In one embodiment, each of the first layers has a thickness greater than 45 Angstroms and less than 55 Angstroms; each of the second layers has a thickness greater than 10 Angstroms and less than 16 Angstroms; x is greater than 63% and less than 67%; and y is greater than 0% and less than 1%.

In one embodiment, the infrared includes: a substrate; a first contact layer directly on the substrate; the absorber layer directly on the first contact layer; a barrier layer directly on the absorber layer; and a second contact layer directly on the barrier layer, wherein one of: the first contact layer; the barrier layer; and the second contact layer, includes a second superlattice structure including: at least three first layers; and at least three second layers, alternating with the first layers, each of the first layers including, as a major component, InAs$_x$P$_{1-x}$, wherein x is between 0.0% and 99.0%, and each of the second layers including, as a major component, InAs$_y$Sb$_{1-y}$, wherein y is between 0% and 60%.

In one embodiment, the barrier layer includes the second superlattice structure.

In one embodiment, each of the first layers has a thickness greater than 45 Angstroms and less than 70 Angstroms.

In one embodiment, each of the second layers has a thickness greater than 10 Angstroms and less than 25 Angstroms.

In one embodiment, x is greater than 60% and less than 80%.

In one embodiment, each of the first layers has a thickness greater than 45 Angstroms and less than 55 Angstroms; each of the second layers has a thickness greater than 10 Angstroms and less than 25 Angstroms; x is greater than 63% and less than 67%; and y is greater than 0% and less than 1%.

In one embodiment, the first contact layer includes the second superlattice structure.

In one embodiment, the second contact layer includes the second superlattice structure.

According to an embodiment of the present invention there is provided a method for fabricating an infrared photodetector, the method including: forming an absorber layer, the forming of the absorber layer including: depositing a first pair of layers; depositing a second pair of layers; and depositing a third pair of layers, each of the first pair of layers, the second pair of layers and the third pair of layers including a respective first layer and a respective second layer, each of the first layers including, as a major component, InAs$_x$P$_{1-x}$, wherein x is between 0.0% and 99.0%, and each of the second layers including, as a major component, InAs$_y$Sb$_{1-y}$, wherein y is between 0% and 60%.

In one embodiment, the method includes forming a first contact layer, the forming of the first contact layer including: depositing a fourth pair of layers; depositing a fifth pair of layers; and depositing a sixth pair of layers, each of the fourth pair of layers, the fifth pair of layers and the sixth pair of layers including a respective first layer and a respective second layer, each of the first layers including, as a major component, $InAs_xP_{1-x}$, wherein x is between 0.0% and 99.0%, and each of the second layers including, as a major component, $InAs_ySb_{1-y}$, wherein y is between 0% and 60%.

In one embodiment, the method includes forming a second contact layer, the forming of the second contact layer including: depositing a seventh pair of layers; depositing a eighth pair of layers; and depositing a ninth pair of layers, each of the seventh pair of layers, the eighth pair of layers and the ninth pair of layers including a respective first layer and a respective second layer, each of the first layers including, as a major component, $InAs_xP_{1-x}$, wherein x is between 0.0% and 99.0%, and each of the second layers including, as a major component, $InAs_ySb_{1-y}$, wherein y is between 0% and 60%.

In one embodiment, the method includes forming a barrier layer, the forming of the barrier layer including: depositing a fourth pair of layers; depositing a fifth pair of layers; and depositing a sixth pair of layers, each of the fourth pair of layers, the fifth pair of layers and the sixth pair of layers including a respective first layer and a respective second layer, each of the first layers including, as a major component, $InAs_xP_{1-x}$, wherein x is between 0.0% and 99.0%, and each of the second layers including, as a major component, $InAs_ySb_{1-y}$, wherein y is between 0% and 60%.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a high quantum efficiency superlattice infrared detector provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Antimony (Sb) based superlattice structures including InAs/indium gallium antimonide (InGaSb) and InAs/InAsSb superlattice structures may be employed for infrared detection and imaging. Such structures may provide flexibility to tune the detection wavelength across the entire infrared regime. A p-type superlattice absorber may achieve high quantum efficiency due to long minority carrier (electron) diffusion length, but the p-type nature of the superlattice may cause devices to suffer from detrimental surface current due to carrier inversion to n-type at the surface. A structure with an n-type absorber may be less susceptible to this surface inversion issue, making the device fabrication process more robust and capable of producing higher yields. However, an n-type absorber may have a short minority carrier (hole) diffusion length, and thus may suffer from low quantum efficiency.

Embodiments of the present invention may mitigate some or all of these problems. For example in some embodiments the intrinsic absorption coefficient is enhanced, independent of the doping type.

Figure 1:
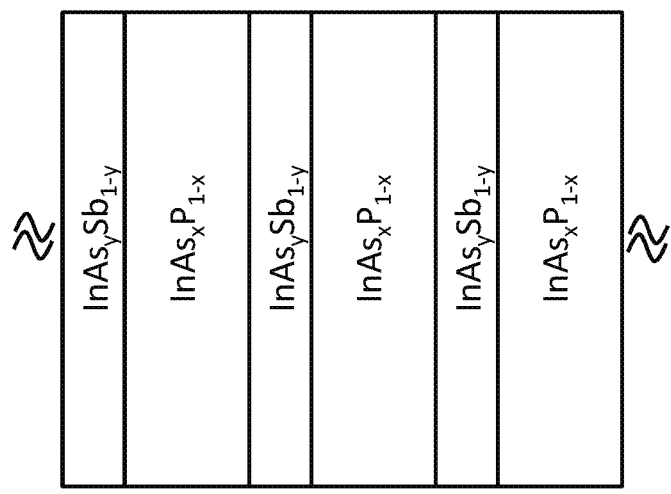
FIG. 1 is a schematic diagram of a superlattice structure, according to an embodiment of the present invention.

Referring to FIG. 1, embodiments of the present invention include a superlattice design made of periodically adjacent (or "alternating") $InAs_xP_{1-x}/InAs_ySb_{1-y}$ layers with arbitrary arsenic content, each of x and y being between 0 and 100%. The flexibility to change x and y allows for the fabrication of superlattice structures with various combinations of certain desired properties, including but not limited to:

(1) having a targeted cut-off wavelength;

(2) being closely lattice matched to a substrate material, such as GaSb, for high material quality;

(3) having a thin (i.e., short) period (e.g., each pair of layers having a small total thickness) with enhanced electron-hole wave function for larger absorption coefficient; and (4) having a thinner individual barrier width for holes, resulting in smaller effective mass, and hence higher mobility.

In an InAs/InAsSb superlattice without phosphorous, properties (1) and (2) may be traded off against properties (3) and (4) of the list above. To achieve a target cut-off wavelength, for example 10 μm the As composition in the InAsSb layer may be below 60%, and the thickness may be, at the minimum, tens of Angstroms. To meet the lattice match condition (2), a relatively thick InAs layer (e.g., greater than 80 Angstroms) may be used, which may result in a degradation of properties (3) and (4).

If phosphorous is included (so that the superlattice is a "phosphorus-bearing" superlattice), e.g., if layers of majorly $InAs_xP_{1-x}$, are used instead of layers of InAs, then the lattice constant of these layers (i.e., the $InAs_xP_{1-x}$, layers) is substantially reduced (relative to the lattice constant of InAs). As a result, the $InAs_xP_{1-x}$ layers may more readily compensate for the large lattice constant InAsSb layers for strain balancing to a substrate, for example, a GaSb substrate, and thinner InAsP layers may be sufficient for lattice matching to the GaSb substrate, thus satisfying properties (3) and (4) to a greater extent. This ability to more readily provide lattice matching to the GaSb substrate may also make possible larger Sb content (and lower As content) in the InAsSb layer, which results in achieving properties (1), (3), and (4) to an extent not readily achievable in an InAs/InAsSb superlattice.

Figure 2:
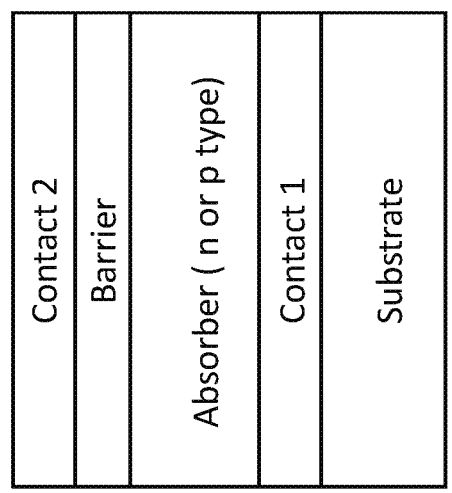
FIG. 2 is a schematic diagram of an infrared detector, according to an embodiment of the present invention.

The phosphorus-bearing superlattice InAsP/InAsSb may be either intrinsic (i.e., not being intentionally doped), or doped n-type or p-type. Accordingly, referring to FIG. 2, an InAsP/InAsSb superlattice structure may be, or be used in, any component of a barrier diode infrared detector, such as in the first contact (contact 1), the absorber, the barrier, or the second contact (contact 2). In one embodiment, the phosphorus-bearing superlattice is used in the absorber; in this embodiment it may provide an enhanced absorption coefficient and enhanced diffusion length. Moreover, an InAsP/InAsSb superlattice structure according to an embodiment of the present invention may be used in devices other than a barrier diode infrared detector; they may be used, for example, to construct homojunctions, p-n junctions, and photoconductors. The superlattice structure may have at least three pairs of alternating first and second layers, with the first layers including, as a major component, $InAs_xP_{1-x}$, and with the second layers including, as a major component, $InAs_ySb_{1-y}$. The first layers may be thicker or thinner than the second layers or they may be the same thickness. In some embodiments, the superlattice structure includes at least 3 such pairs of layers, and may include as many as 10,000 such pairs of layers.

Figure 3:
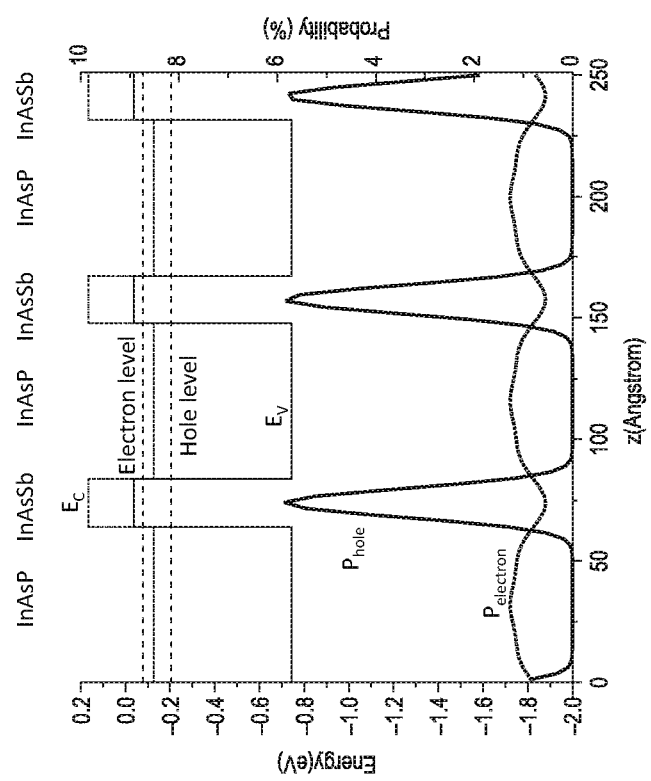
FIG. 3 is a combined energy band diagram and wave function graph, according to an embodiment of the present invention.

FIG. 3 illustrates the working principle for the enhancement of the absorption coefficient of an InAsP/InAsSb superlattice. The upper part of FIG. 3 shows a sketch of the conduction band and valence band alignment, and the effective conduction band and valence band levels (represented by dashed lines) where electrons and holes reside. As will be understood by those of skill in the art, the cutoff wavelength of the superlattice structure may be tuned by adjusting the respective thicknesses of the layers.

Spatial confinement of electron and hole wave functions is shown in the lower part of FIG. 3. To enhance to absorption coefficient, the overlap between hole and electron wave functions may be increased. This may be achieved by decreasing the superlattice period while strain-balancing to the substrate for high material quality.

Figure 4:
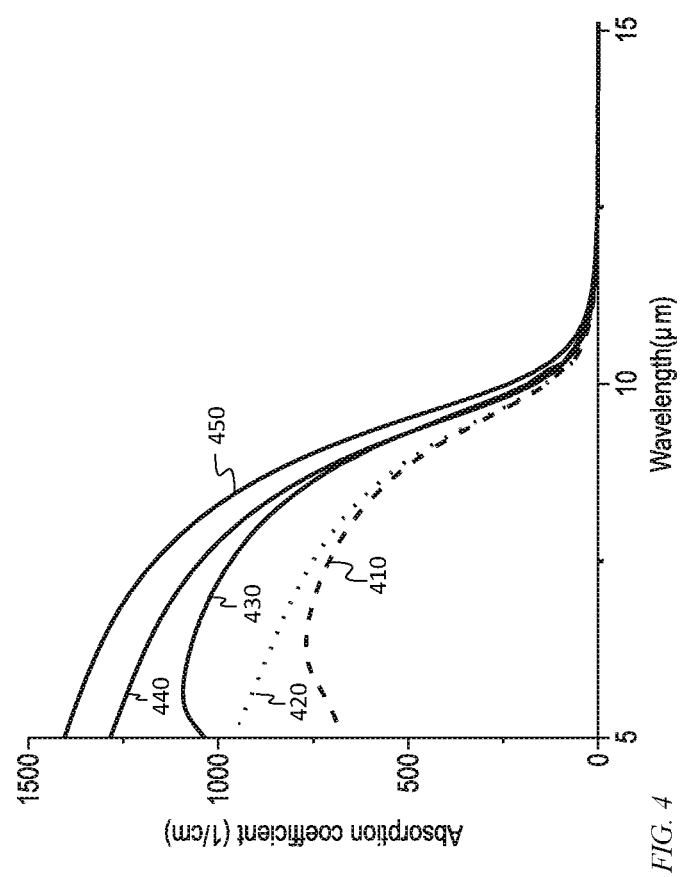
FIG. 4 is a graph of absorption coefficient as a function of wavelength, according to an embodiment of the present invention.

FIG. 4 shows the simulated absorption coefficient for various superlattice designs. Simulations were performed using the NRL MULTIBANDS™ software. The examples illustrated in FIG. 4 are candidates for long wavelength infrared (LWIR) detection ($\lambda=10$ µm) but the principle can be applied for any wavelength in the infrared regime. For example, some embodiments may be used to detect electromagnetic radiation with a wavelength as short as 1 microns or as long as 100 microns. A first curve 410 shows the simulated absorption coefficient for a first reference design, which includes 90 Angstrom layers of InAs alternating with 25 Angstrom layers of $InAs_{0.53}Sb_{0.47}$. A second curve 420 shows the simulated absorption coefficient for a second reference design, which includes 85 Angstrom layers of InAs alternating with 11 Angstrom layers of $InAs_{0.3}Sb_{0.7}$. Three further curves 430, 440, 450 show the simulated absorption coefficients for three embodiments of the present invention. That is, a third curve 430 shows the simulated absorption coefficient for a first embodiment, which includes 64 Angstrom layers of $InAs_{0.75}P_{0.25}$ alternating with 20 Angstrom layers of $InAs_{0.3}Sb_{0.7}$. A fourth curve 440 shows the simulated absorption coefficient for a second embodiment, which includes 55 Angstrom layers of $InAs_{0.76}P_{0.24}$ alternating with 11 Angstrom layers of InSb. A fifth curve 450 shows the simulated absorption coefficient for a third embodiment, which includes 50 Angstrom layers of $InAs_{0.65}P_{0.35}$ alternating with 13 Angstrom layers of InSb.

The second reference design (represented by the second curve 420) has slightly better absorption coefficient than the first reference design (represented by the first curve 410), due to a thinner (e.g., shorter) superlattice period, with higher Sb concentration in the InAsSb layer. The improvement is marginal, however, especially near the cut-off wavelength (10 µm). The addition of phosphorus enhances the absorption coefficient, with a thinner superlattice period, as shown by the third curve 430, the fourth curve 440, and the fifth curve 450, corresponding to the first, second, and third embodiments respectively. A significant improvement (50%) is achieved with the third embodiment, in which the superlattice structure has a 63 Angstrom period including 50 Angstrom layers of $InAs_{0.65}P_{0.35}$ alternating with 13 Angstrom layers of InSb.

In other embodiments the compositions and thicknesses of the layers may be varied from those of the third embodiment, with, e.g., the proportion of arsenic (relative to phosphorous) being between 0% and 99% in the InAsP (e.g., $InAs_xP_{1-x}$) layers (to form, e.g., $InAs_{0.80}P_{0.20}$ or $InAs_{0.50}P_{0.50}$), and with the proportion of arsenic being between 0% and 60% in the InAsSb (e.g., $InAs_ySb_{1-y}$) layers (to form, e.g., $InAs_{0.60}Sb_{0.40}$). Moreover, the thicknesses of each of the InAsP and InAsSb layers may be varied, so that, e.g., the InAsP layers may have a thickness between 3.0 Angstroms and 200.0 Angstroms, and the InAsSb layers may have a thickness between 3.0 Angstroms and 100.0 Angstroms.

In some embodiments the composition of one or more layers is not uniform, e.g., a portion of one of the InAsP layers may have a proportion of arsenic (relative to phosphorous) of 5% and another portion of the same layer may have a proportion of arsenic of 95%. In some embodiments additional elements are present in one or more layers, e.g., one or more layers may contain gallium or aluminum.

In some embodiments the incorporation of phosphorus reduces the hole effective mass, which can lead to an increase in diffusion length. This is suggested by the following theory:

$$L = \sqrt{D\tau}$$
$$D = \frac{kT}{q}\mu$$
$$\mu = \frac{q\bar{\tau}}{m^*}$$

where

L is the diffusion length

D is the diffusivity $\tau$ is the diffusion lifetime k is Boltzmann's constant

T is the temperature q is the electron charge

µ is the mobility $\bar{\tau}$ is the scattering lifetime, and m* is the effective mass.

Combining the above equations results in the following:

$$L = \sqrt{\frac{kT\tau\bar{\tau}}{m^*}} \propto \frac{1}{\sqrt{m^*}}$$

From this derivation it can be seen that the diffusion length may be inversely proportional to the square root of the effective mass.

Table 1 shows the simulated hole effective mass ($m_h$) along the growth direction for the first and second reference designs ("Ref1" and "Ref2" respectively), and for the first, second, and third embodiments ("Design 1", "Design 2" and "Design 3" respectively). The first, second, and third embodiments of Table 1 (and of Table 2) are those for which simulated absorption coefficients are shown in FIG. 4.

TABLE 1

Comparison of hole effective mass, and improvement factor compared to two reference designs

| Design | $m_h$ | $m_{h\text{-}ref1}/m_h$ | $m_{h\text{-}ref2}/m_h$ |
|---|---|---|---|
| Ref1: 90Å InAs/25Å InAs$_{0.53}$Sb$_{0.47}$ | 27.9 | | |
| Ref2: 85Å InAs/11Å InAs$_{0.3}$Sb$_{0.7}$ | 0.87 | | |
| Design 1: 64Å InAs$_{0.75}$P$_{0.25}$/20Å InAs$_{0.3}$Sb$_{0.7}$ | 4.29 | 6.5 | 0.45 |
| Design 2: 55Å InAs$_{0.76}$P$_{0.24}$/11Å InSb | 0.313 | 89 | 2.8 |
| Design 3: 50Å InAs$_{0.65}$P$_{0.35}$/13Å InSb | 0.402 | 69 | 2.2 |

The improvement ratios compared to the first and second reference designs ($m_{h\text{-}ref1}/m_h$ and $m_{h\text{-}ref2}/m_h$) are listed in the last two columns of Table 1. The advantage of the three InAsP/InSb designs (the first, second, and third embodiments) over design 1 can be seen, e.g., from the effective mass improvement factor of 89 and 69 for the second and third embodiments, respectively. Compared to the second reference design, the second and third embodiments show an improvement in hole effective mass of more than a factor of 2.

In some embodiments the incorporation of phosphorus also increases the electron effective mass. In contrast to the holes in the valence band whose effective mass may need to be decreased to increase diffusion length, the effective mass of the electrons in the conduction band may be small enough that the diffusion length of electrons (as minority carriers) does not limit device performance. To the contrary, a larger electron effective mass may help to avoid detrimental tunneling current that increases the detector's noise. A large effective mass may give III-V superlattice detectors an advantage over mercury cadmium telluride (HgCdTe) detectors, and this advantage may be further increased in a phosphorus-bearing superlattice. As shown in Table 2, an InAs/InAsSb superlattice structure (e.g., the structures of the two reference designs, Ref1 and Ref2) may have an electron effective mass ($m_e$) of about 0.013 due to a large offset between the conduction band of InAs and the valence band of InAsSb (which forms a type-II gap). The inclusion of phosphorus may result in a reduced band offset, between InAsP and InAsSb, creating a larger barrier for electrons. As a result, the electron effective mass may be increased by almost a factor of 2, as can be seen from the rows of Table 2 corresponding to the first, second and third embodiments ("Design 1", "Design 2" and "Design 3" respectively). This improvement is more important at longer wavelengths where tunneling may be a critical mechanism. The tunneling current may depend exponentially on electron effective mass, and thus a small improvement in effective mass may result in a large reduction in the tunneling current.

Comparison of electron effective mass, and improvement factor compared to two reference designs

| Design | $m_e$ | $m_e/m_{e\text{-}ref1}$ | $m_e/m_{e\text{-}ref2}$ |
|---|---|---|---|
| Ref1: 90Å InAs/25Å InAs$_{0.53}$Sb$_{0.47}$ | 0.0138 | | |
| Ref2: 85Å InAs/11Å InAs$_{0.3}$Sb$_{0.7}$ | 0.0132 | | |
| Design 1: 64Å InAs$_{0.75}$P$_{0.25}$/20Å InAs$_{0.3}$Sb$_{0.7}$ | 0.02 | 1.45 | 1.51 |
| Design 2: 55Å InAs$_{0.76}$P$_{0.24}$/11Å InSb | 0.023 | 1.67 | 1.74 |
| Design 3: 50Å InAs$_{0.65}$P$_{0.35}$/13Å InSb | 0.0268 | 1.94 | 2.03 |

TABLE 2:

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a high quantum efficiency superlattice infrared detector have been specifically described and illustrated herein, many modifications and variations will be apparent to those skilled in the art. Accordingly, it is to be understood that a high quantum efficiency superlattice infrared detector constructed according to principles of this invention may be embodied other than as specifically described herein. The invention is also defined in the following claims, and equivalents thereof.

What is claimed is:

1. An infrared detector, comprising:
    an absorber layer comprising:
        a first superlattice structure of the infrared detector comprising:
            at least three first layers; and
            at least three second layers, alternating with the at least three first layers,
        each of the at least three first layers comprising, as a major component, $InAs_xP_{1-x}$, wherein x is between 0% and 99%,
        each of the at least three second layers comprising, as a major component, $InAs_ySb_{1-y}$, wherein y is between 0% and 30%,
        each of the at least three second layers having a thickness greater than 10 Angstroms and less than 25 Angstroms, and
        the first superlattice structure has a type II band alignment.

2. The infrared detector of claim 1, wherein the first superlattice structure comprises an equal number of first layers of the at least three first layers and second layers of the at least three second layers.

3. The infrared detector of claim 1, wherein each of the at least three first layers has a thickness greater than or equal to 50 Angstroms and less than 70 Angstroms.

4. The infrared detector of claim 1, wherein x is greater than 60% and less than 80%.

5. The infrared detector of claim 1, wherein:
    each of the at least three first layers has a thickness greater than 45 Angstroms and less than 55 Angstroms;
    each of the at least three second layers has the thickness greater than 10 Angstroms and less than 16 Angstroms;
    x is greater than 63% and less than 67%; and
    y is greater than 0% and less than 1%.

6. The infrared detector of claim 1, comprising:
    a substrate;
    a first contact layer directly on the substrate;
    the absorber layer directly on the first contact layer;
    a barrier layer directly on the absorber layer; and
    a second contact layer directly on the barrier layer,
    wherein one of:
        the first contact layer;
        the barrier layer; and
        the second contact layer,
    comprises a second superlattice structure comprising:
        at least three first layers; and
        at least three second layers, alternating with the at least three first layers, each of the at least three first layers of the second superlattice structure comprising, as a major component, $InAsxP1-x$, wherein x is between 0% and 99, and
        each of the at least three second layers of the second superlattice structure comprising, as a major component, $InAsySb1-y$, wherein y is between 0% and 60%.

7. The infrared detector of claim 6, wherein the barrier layer comprises the second superlattice structure.

8. The infrared detector of claim 7, wherein each of the at least three first layers of the second superlattice structure has a thickness greater than 45 Angstroms and less than 70 Angstroms.

9. The infrared detector of claim 7, wherein each of the at least three second layers of the second superlattice structure has a thickness greater than 10 Angstroms and less than 25 Angstroms.

10. The infrared detector of claim 7, wherein in the second superlattice structure, x is greater than 60% and less than 80%.

11. The infrared detector of claim 7, wherein:
    each of the at least three first layers of the second superlattice structure has a thickness greater than 45 Angstroms and less than 55 Angstroms;
    each of the at least three second layers of the second superlattice structure has a thickness greater than 10 Angstroms and less than 25 Angstroms;
    in the second superlattice structure,
    x is greater than 63% and less than 67%; and
    y is greater than 0% and less than 1%.

12. The infrared detector of claim 6, wherein the first contact layer comprises the second superlattice structure, and
    wherein the substrate comprises GaSb.

13. The infrared detector of claim 6, wherein the second contact layer comprises the second superlattice structure.

14. The infrared detector of claim 1, further comprising:
    a GaSb substrate; and
    a first contact layer between the first absorber layer and the GaSb substrate, the first contact layer comprising a third superlattice structure,
    wherein the third superlattice structure comprises:
        at least three first layers including a bottommost first layer; and at least three second layers, alternating with the at least three first layers, each of the at least three first layers of the third superlattice structure comprising, as a major component, $InAs_{x'}P_{1-x'}$, wherein x' is between 0% and 99%, and each of the at least three second layers of the third superlattice structure comprising, as a major component, $InAs_{y'}Sb_{1-y'}$, wherein y' is between 0% and 60%, and wherein the bottommost first layer is directly on the GaSb substrate.

15. A method for fabricating an infrared photodetector, the method comprising:

forming an absorber layer comprising:

forming a first superlattice structure having a type II band alignment;

the forming of the first superlattice structure comprising:

depositing a first pair of layers;
depositing a second pair of layers; and
depositing a third pair of layers, each of the first pair of layers, the second pair of layers and the third pair of layers comprising a respective first layer and a respective second layer, each respective first layers comprising, as a major component, $InAs_xP_{1-x}$, wherein x is between 0% and 99%, each respective second layers comprising, as a major component, $InAs_ySb_{1-y}$, wherein y is between 0% and 30%, and having a thickness greater than 10 Angstroms and less than 25 Angstroms.

16. The method of claim 15, further comprising:

forming a first contact layer, the forming of the first contact layer comprising:

depositing a fourth pair of layers;
depositing a fifth pair of layers; and
depositing a sixth pair of layers, each of the fourth pair of layers, the fifth pair of layers and the sixth pair of layers comprising a respective first layer and a respective second layer, each respective first layers of the first contact layer comprising, as a major component, $InAs_xP_{1-x}$, wherein x is between 0% and 99%, and each respective second layers of the first contact layer comprising, as a major component, $InAs_ySb_{1-y}$, wherein y is between 0% and 60%.

17. The method of claim 16, further comprising forming a second contact layer, the forming of the second contact layer comprising:

depositing a seventh pair of layers;
depositing a eighth pair of layers; and
depositing a ninth pair of layers, each of the seventh pair of layers, the eighth pair of layers and the ninth pair of layers comprising a respective first layer and a respective second layer, each respective first layers of the second contact layer comprising, as a major component, $InAs_xP_{1-x}$, wherein x is between 0% and 99%, and each respective second layers of the second contact layer comprising, as a major component, $InAs_ySb_{1-y}$, wherein y is between 0% and 60%.

18. The method of claim 15, further comprising forming a barrier layer, the forming of the barrier layer comprising:

depositing a fourth pair of layers;
depositing a fifth pair of layers; and
depositing a sixth pair of layers, each of the fourth pair of layers, the fifth pair of layers and the sixth pair of layers comprising a respective first layer and a respective second layer, each respective first layers of the barrier layer comprising, as a major component, $InAs_xP_{1-x}$, wherein x is between 0% and 99%, and each respective second layers of the barrier layer comprising, as a major component, $InAs_ySb_{1-y}$, wherein y is between 0% and 60%.

\* \* \* \* \*